(12) United States Patent
Itokazu et al.

(10) Patent No.: US 12,550,419 B2
(45) Date of Patent: Feb. 10, 2026

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Hiroko Itokazu, Kawasaki Kanagawa (JP); Tomoko Matsudai, Shibuya Tokyo (JP); Yoko Iwakaji, Meguro Tokyo (JP); Keiko Kawamura, Yokohama Kanagawa (JP); Kaori Fuse, Yokohama Kanagawa (JP)

(73) Assignees: KABUSHIKI KAISHA TOSHIBA, Kawasaki (JP); TOSHIBA ELECTRONIC DEVICES & STORAGE CORPORATION, Kawasaki (JP)

( * ) Notice: Subject to any disclaimer, the term of this patent is extended or adjusted under 35 U.S.C. 154(b) by 743 days.

(21) Appl. No.: 17/901,668

(22) Filed: Sep. 1, 2022

(65) Prior Publication Data
US 2023/0299076 A1 Sep. 21, 2023

(30) Foreign Application Priority Data
Mar. 17, 2022 (JP) .................................. 2022-042802

(51) Int. Cl.
*H01L 27/06* (2006.01)
*H10D 12/00* (2025.01)
(Continued)

(52) U.S. Cl.
CPC ......... *H10D 84/617* (2025.01); *H10D 12/481* (2025.01); *H10D 62/393* (2025.01)

(58) Field of Classification Search
None
See application file for complete search history.

(56) References Cited

U.S. PATENT DOCUMENTS

| 8,415,711 B2 | 4/2013 | Kitagawa |
| 10,418,441 B2 | 9/2019 | Naito |

(Continued)

FOREIGN PATENT DOCUMENTS

| JP | 2012089826 A | 5/2012 |
| JP | 2017103456 A | 6/2017 |

(Continued)

*Primary Examiner* — William C Trapanese
(74) *Attorney, Agent, or Firm* — Holtz, Holtz & Volek PC

(57) ABSTRACT

A semiconductor device includes a semiconductor part, first and second electrodes and first-third and second-third electrodes. The semiconductor part is provided between the first and second electrodes. The semiconductor part includes a first semiconductor layer of a first conductivity type, second and third semiconductor layers of a second conductivity type. The second and third semiconductor layers are arranged between the first layer and the second electrode. The first-third and second-third electrodes are provided in the semiconductor part. The second semiconductor layer is provided between the first-third electrode and the second-third electrode. The second electrode includes a contact portion extending into the second semiconductor layer. The third semiconductor layer is provided on the second semiconductor layer between the contact portion and the second-third electrode. The second semiconductor layer includes a first portion facing the third semiconductor layer via the contact portion.

20 Claims, 7 Drawing Sheets

(51) Int. Cl.
*H10D 62/17* (2025.01)
*H10D 84/60* (2025.01)

(56) References Cited

U.S. PATENT DOCUMENTS

| | | |
|---|---|---|
| 2015/0262999 A1 | 9/2015 | Ogura |
| 2015/0263148 A1 | 9/2015 | Ogura et al. |
| 2017/0148786 A1* | 5/2017 | Matsushita .......... H10D 12/038 |
| 2021/0234027 A1 | 7/2021 | Yoshida |
| 2021/0296477 A1 | 9/2021 | Matsudai et al. |

FOREIGN PATENT DOCUMENTS

| | | |
|---|---|---|
| JP | 6311723 B2 | 3/2018 |
| JP | 2021150483 A | 9/2021 |
| WO | 2020213254 A1 | 10/2020 |

* cited by examiner

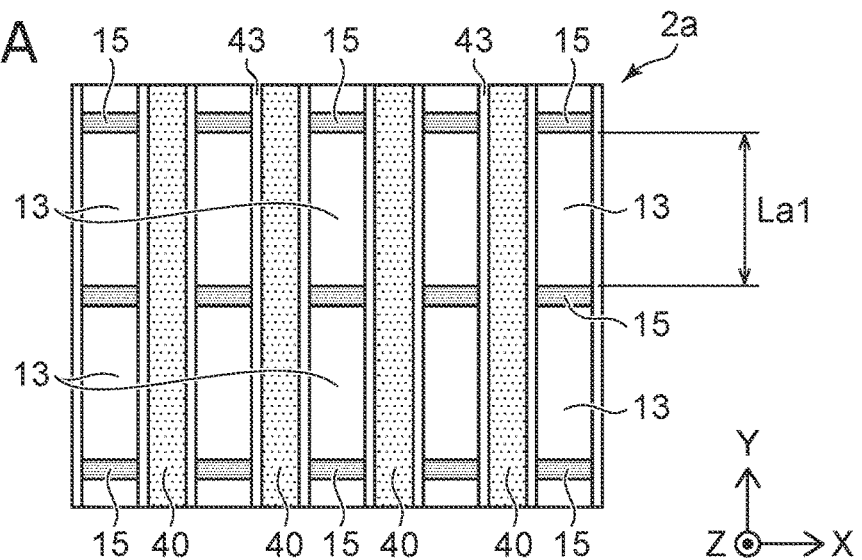
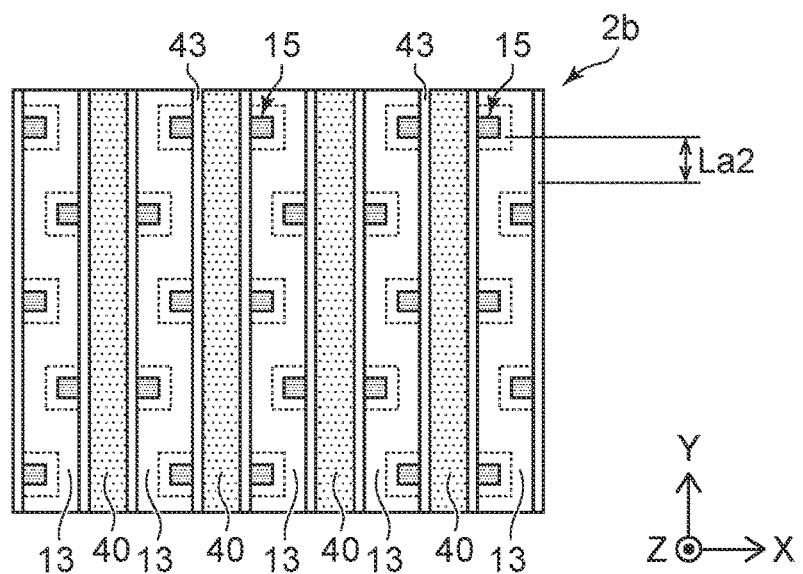
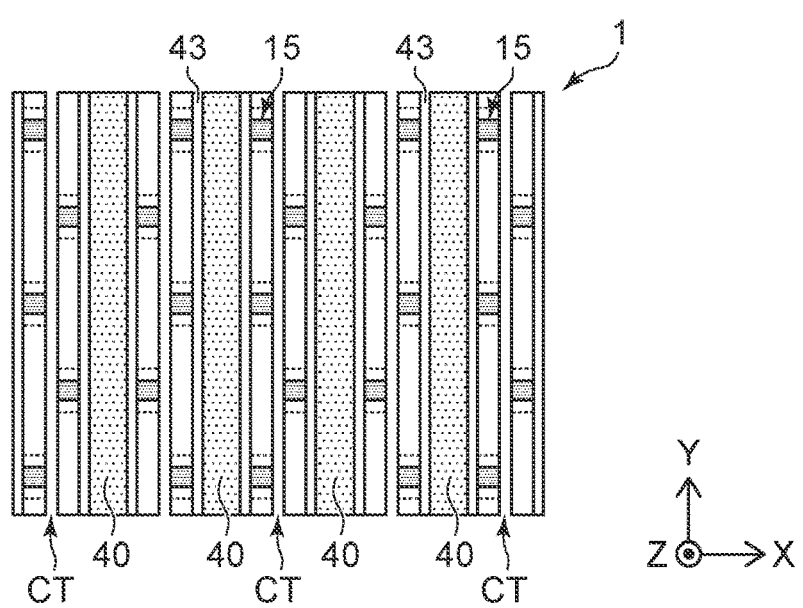

SEMICONDUCTOR DEVICE

CROSS-REFERENCE TO RELATED APPLICATIONS

This application is based upon and claims the benefit of priority from Japanese Patent Application No. 2022-042802, filed on Mar. 17, 2022; the entire contents of which are incorporated herein by reference.

FIELD

Embodiments relate to a semiconductor device.

BACKGROUND

A semiconductor device used in a power conversion device such as an inverter is required to have a small switching loss and a large breakdown resistance.

BRIEF DESCRIPTION OF THE DRAWINGS

FIGS. 3A to 3C are other schematic plan views showing the semiconductor device according to the embodiment;

DETAILED DESCRIPTION

Figure 1:
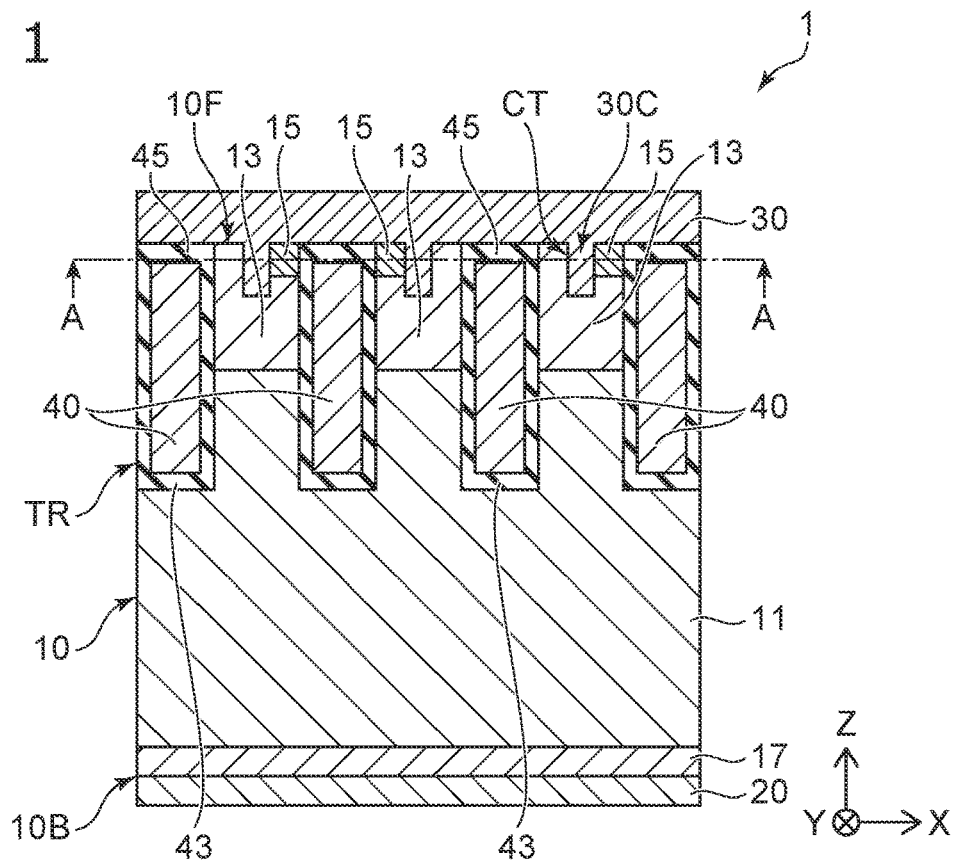
FIG. 1 is a schematic cross-sectional view showing a semiconductor device according to an embodiment.

According to one embodiment, a semiconductor device includes a semiconductor part, first and second electrodes and a plurality of third electrodes. The semiconductor part includes a first semiconductor layer of a first conductivity type, a second semiconductor layer of a second conductivity type, and a third semiconductor layer of the second conductivity type. The first electrode is electrically connected to the first semiconductor layer of the semiconductor part. The second electrode is electrically connected to the second semiconductor layer and the third semiconductor layer of the semiconductor part. The plurality of third electrodes are provided in the semiconductor part and electrically insulated from the semiconductor part by a first insulating film. The semiconductor part is provided between the first electrode and the second electrode. The first semiconductor layer extends between the first electrode and the second electrode. The second semiconductor layer is provided between the first semiconductor layer and the second electrode. The third semiconductor layer is partially provided on the second semiconductor layer between the second semiconductor layer and the second electrode. The third semiconductor layer includes a second conductivity type impurity with a concentration higher than a concentration of a second conductivity type impurity in the second semiconductor layer. The plurality of third electrodes each are provided inside a first trench extending into the first semiconductor layer from a front surface of the semiconductor part at the second electrode side. The plurality of third electrodes include a first-third electrode and a second-third electrode. The first-third and second-third electrodes are adjacent to each other. The second semiconductor layer is provided between the first-third electrode and the second-third electrode. The second semiconductor layer faces the first-third electrode and the second-third electrode respectively via the first insulating film. The semiconductor part further includes a second trench between the first-third electrode and the second-third electrode. The second trench extends from the front surface of the semiconductor part into the second semiconductor layer. The second electrode includes a contact portion extending into the second trench. The third semiconductor layer is provided between the contact portion of the second electrode and the second-third electrode. The third semiconductor layer faces the second-third electrode via the first insulating film. The second semiconductor layer includes a first portion provided between the contact portion of the second electrode and the first-third electrode. The third semiconductor layer faces the first portion of the second semiconductor layer via the contact portion of the second electrode.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is a diode. The semiconductor device 1 acts as, for example, a free wheel diode (FWD) in a power conversion device. The semiconductor device 1 may be integrated with, for example, an insulated gate bipolar transistor (IGBT).

As shown in FIG. 1, the semiconductor device 1 includes a semiconductor part 10, a first electrode 20, and a second electrode 30. The semiconductor part 10 is provided between the first electrode 20 and the second electrode 30. The first electrode 20 is a cathode electrode. The second electrode 30 is an anode electrode. The semiconductor part 10 is, for example, silicon. The first electrode 20 is provided on a back surface 10B of the semiconductor part 10. The second electrode 30 is provided on a front surface 10F of the semiconductor part 10.

The semiconductor part 10 includes a first semiconductor layer 11 of a first conductivity type, a second semiconductor layer 13 of a second conductivity type, a third semiconductor layer 15 of the second conductivity type, and a fourth semiconductor layer 17 of the first conductivity type. Hereinafter, the first conductivity type is described as an n-type and the second conductivity type is described as a p-type.

The first semiconductor layer 11 is, for example, an n-type low-concentration layer. The first semiconductor layer 11 includes an n-type impurity with a low concentration. The first semiconductor layer 11 extends between the first electrode 20 and the second electrode 30.

The second semiconductor layer 13 is, for example, a p-type anode layer. The second semiconductor layers 13 are provided between the first semiconductor layer 11 and the second electrode 30. The second electrode 30 is in contact with the second semiconductor layers 13. The second electrode 30 is connected to the second semiconductor layers 13 with, for example, a Schottky connection.

The third semiconductor layer 15 is, for example, a p-type high-concentration layer. The third semiconductor layer 15 includes a second conductivity type impurity with a concentration higher than a concentration of the second conductivity type impurity in the second semiconductor layers 13. The third semiconductor layers 15 are partially provided between the second semiconductor layers 13 and the second electrode 30. The third semiconductor layer 15 is provided on the second semiconductor layers 13. The third semiconductor layer 15 is in contact with the second electrode 30, and is electrically connected to the second electrode 30. The second electrode 30 is connected to the third semiconductor layers 15, for example, with an ohmic connection.

The fourth semiconductor layer 17 is, for example, an n-type cathode layer. The fourth semiconductor layer 17 is provided between the first semiconductor layer 11 and the first electrode 20. The fourth semiconductor layer 17 includes a first conductivity type impurity with a concentration higher than a concentration of the first conductivity type impurity in the first semiconductor layer 11. The first electrode 20 is in contact with the fourth semiconductor layer 17, and is electrically connected to the fourth semiconductor layer 17. The first electrode 20 is connected to the fourth semiconductor layer 17 with, for example, an ohmic connection.

As shown in FIG. 1, the semiconductor device 1 further includes multiple third electrodes 40. The third electrodes 40 are, for example, provided in the semiconductor part 10 between the first electrode 20 and the second electrode 30. Multiple trenches TR are provided on the front surface 10F side of the semiconductor part 10. The multiple third electrodes 40 are provided in the multiple trenches TR, respectively. The third electrodes 40 are electrically insulated from the semiconductor part 10 by first insulating films 43.

The third electrodes 40 are arranged in a direction along the front surface 10F of the semiconductor part 10, for example, in the X-direction. The second semiconductor layer 13 is provided between two adjacent third electrodes 40. The second semiconductor layer 13 faces the two adjacent third electrodes 40 via the first insulating films 43, respectively.

In the example, the third electrodes 40 are provided between the first electrode 20 and the second electrode 30. The third electrodes 40 each are electrically insulated from the second electrode 30 by a second insulating film 45. The third electrodes 40 electrically insulated from the second electrode 30 can be configured to serve as control electrodes (i.e., gate electrodes).

The second electrode 30 includes a trench contact 30C. The trench contact 30C extends into the second semiconductor layer 13 via a contact trench CT. The contact trench CT extends into the second semiconductor layer 13 from the front surface 10F of the semiconductor part 10. The third semiconductor layer 15 is provided between one of two adjacent third electrodes 40 and the trench contact 30C. The contact trench CT is provided such that a depth in the Z-direction is larger than a thickness in the Z-direction of the third semiconductor layer 15.

The third semiconductor layer 15 faces a third electrode 40 via a first insulating film 43. The third semiconductor layer 15 is in contact with the trench contact 30C. The third semiconductor layer 15 also is in contact with the second electrode 30 at the front surface 10F of the semiconductor part 10. The embodiment is not limited to the example, and the third semiconductor layer 15 may be apart from the trench contact 30C.

Figure 2:
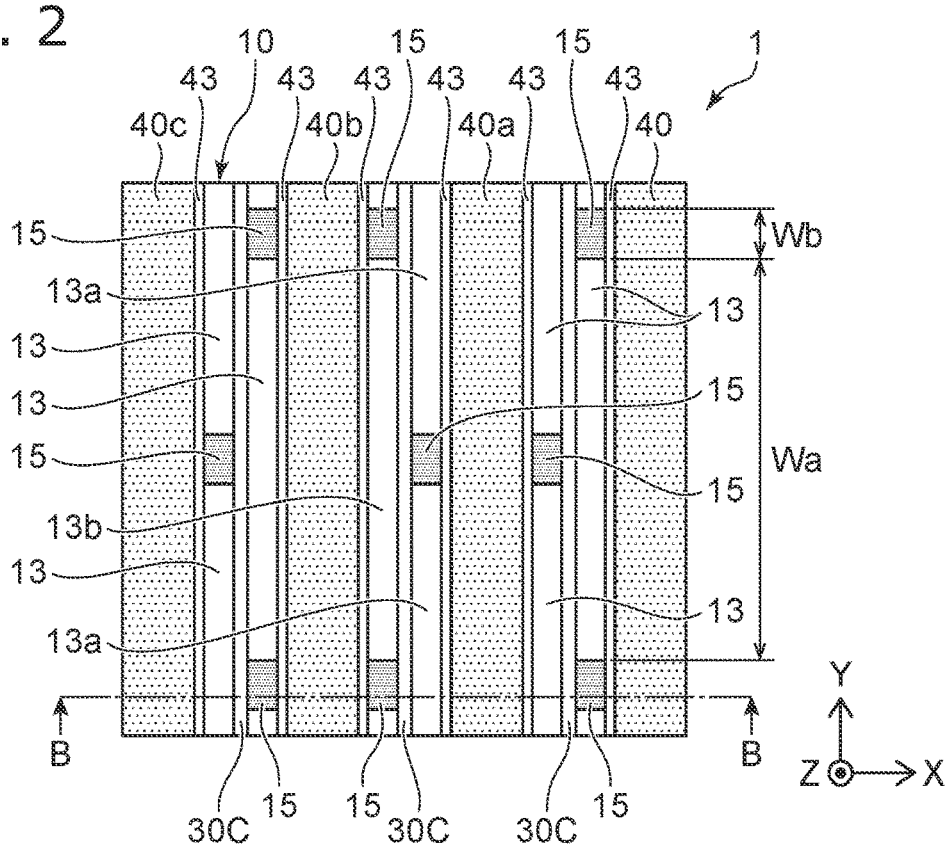
FIG. 2 is a schematic plan view showing the semiconductor device according to the embodiment.

FIG. 2 is a schematic plan view showing the semiconductor device 1 according to the embodiment. FIG. 2 is a cross-sectional view along A-A line in FIG. 1. FIG. 1 is a cross-sectional view along B-B line in FIG. 2.

As shown in FIG. 2, the third electrodes 40 each extend, for example, in the Y-direction. The trench contact 30C extends, for example, in the Y-direction between two adjacent third electrodes 40. Multiple third semiconductor layers 15 are provided between the two adjacent third electrodes 40. Here, the plurality of third electrodes 40 include third electrodes 40a, 40b and 40c. The third electrodes 40a, 40b and 40c are shown for convenience, and do not denote the specified third electrodes.

The third semiconductor layers 15 are apart from each other in the Y-direction between a third electrode 40a of the two adjacent third electrodes 40 and the trench contact 30C. The second semiconductor layer 13 include a first portion 13a provided between a third electrode 40b of the two adjacent third electrodes 40 and the trench contact 30C. The third semiconductor layers each 15 face the first portion 13a of the second semiconductor layers 13 via the trench contact 30C.

The second semiconductor layer 13 further includes a second portion 13b provided between two third semiconductor layers 15 adjacent to each other in the Y-direction. The second portion 13b of the second semiconductor layer 13 is in contact with each of the two adjacent third semiconductor layers 15. A width Wb in the Y-direction of the third semiconductor layer 15 is, for example, smaller than a width Wa in the Y-direction of the second portion 13b of the second semiconductor layer 13 provided between the two adjacent third semiconductor layers 15.

In the example, two third semiconductor layers 15 closest to each other are arranged in the X-direction. For example, one of the two third semiconductor layer 15 is provided between the third electrode 40a and 40b, and the other of the two third semiconductor layers 15 is provided between the third electrodes 40b and 40c. The two third semiconductor layers 15 face each other via a third electrode 40b and first insulating films 43. That is, the two third semiconductor layers 15 provided at both sides of the third electrode 40b face each other without a portion of the second semiconductor layer 13 interposed therebetween.

FIGS. 3A to 3C are other schematic plan views showing the semiconductor device 1 according to the embodiment. FIGS. 3A and 3B are schematic plan views showing semiconductor devices 2a and 2b according to comparative examples. FIG. 3C is a schematic plan view showing the semiconductor device 1.

In the semiconductor device 2a shown in FIG. 3A, the third semiconductor layers 15 are provided to face both of the adjacent third electrodes 40 via the first insulating film 43. The third semiconductor layers 15 are arranged in the Y-direction and apart from each other. The second semiconductor layer 13 has a portion provided between two adjacent third semiconductor layers 15.

The second electrode 30 is connected to the second semiconductor layers 13, for example, with a Schottky connection, and is connected to the second semiconductor layers 15, for example, with an ohmic connection. When a forward voltage is applied between the first electrode 20 and the second electrode 30 (see FIG. 1), more holes are injected from the second electrode 30 into the second semiconductor layers 13 via the third semiconductor layers 15 than holes injected directly to the second semiconductor layers 13 from the second electrode 30. Therefore, the hole amount injected into the second semiconductor layers 13 can be controlled by an area ratio of the second semiconductor layers 13 and the third semiconductor layers 15 at the interface in contact with the second electrode 30.

For example, in order to reduce a switching loss in a turn-off process, it is preferable in a turn-on process to suppress the hole injection from the second semiconductor layers 13 to the first semiconductor layer 11. On the other hand, the on-resistance increases when the hole injection to the first semiconductor layer 11 is excessively suppressed. Therefore, the area ratio of the third semiconductor layers 15 and the second semiconductor layers 13 at the interface contacting the second electrode 30 is required to be suitably controlled.

In the semiconductor device 2a, for example, the hole injection into the second semiconductor layers 13 can be controlled by a ratio of the width Wa to the width Wb. The width Wa is a Y-direction width of the portion of the second semiconductor layers 13 that is in contact with the second electrode 30. The width Wb is the Y-direction width of the third semiconductor layer 15 that is in contact with the second electrode 30. In other words, the hole injection into the second semiconductor layers 13 can be controlled by a distance La1 (i.e., the width Wa) between the third semiconductor layers 15 adjacent to each other in the Y-direction. When the distance La1 in the Y-direction between the adjacent second semiconductor layers 13 is too wide to reduce the hole injection into the second semiconductor layers 13, however, a breakdown resistance against overcurrent is reduced due to the forward current concentration at a position where the third semiconductor layers 15 is provided.

In the semiconductor device 2b shown in FIG. 3B, the third semiconductor layers 15 each are provided to face one of the adjacent third electrodes 40 via the first insulating film 43. The width in the X-direction of the third semiconductor layer 15 is, for example, half the width in the example shown in FIG. 3A. Therefore, without changing the contact area ratio of the second semiconductor layers 13 and the third semiconductor layers 15, a distance La2 in the Y-direction can be provided between the adjacent third semiconductor layers 15. The distance La2 is half the interval La1 shown in FIG. 3A. Accordingly, it is possible to improve the breakdown resistance by relaxing the forward current concentration.

When the third semiconductor layers 15 are formed by ion implantation, however, the ion-implanted second conductivity type impurity is activated by a heat treatment. As shown by broken lines in FIG. 3B, the second conductivity type impurity is inevitably diffused by the heat treatment, and increases the area of the third semiconductor layers 15. Therefore, the contact area ratio of the second semiconductor layers 13 and the third semiconductor layers 15 is changed, and increases the hole injection into the second semiconductor layers 13. Although it may be possible to determine a mask size of the ion implantation beforehand considering the second conductivity type impurity diffusion, the hole amount injected into the second semiconductor layers 13 changes depending on the conditions inevitably changing in a manufacturing process. There may be a case in which a miniaturization limit of mask patterns makes the ion-implantation mask difficult to provide with the consideration of the thermal diffusion.

As shown in FIG. 3C, in the semiconductor device 1, the contact trenches CT are provided between the adjacent third electrodes 40. The contact trench CT removes the diffusion area in the X-direction of the third semiconductor layers 15. Moreover, by forming the contact trenches CT after the ion implantation and then performing the heat treatment, the diffusion in the X-direction of the second conductivity type impurity can be avoided. Accordingly, it is possible in the semiconductor device 1 to prevent the expansion in the X-direction of the third semiconductor layers 15 due to the thermal diffusion of the second conductivity type impurity, and prevent the hole injection from increasing into the second semiconductor layers 13.

In FIG. 3C, the third semiconductor layers 15 are described to be in contact with the contact trenches CT, but the embodiment is not limited thereto. For example, there may be a case where the third semiconductor layers 15 is formed to be apart from the contact trenches CT depending on the manufacturing conditions or accuracy of the mask pattern.

Figure 4A:
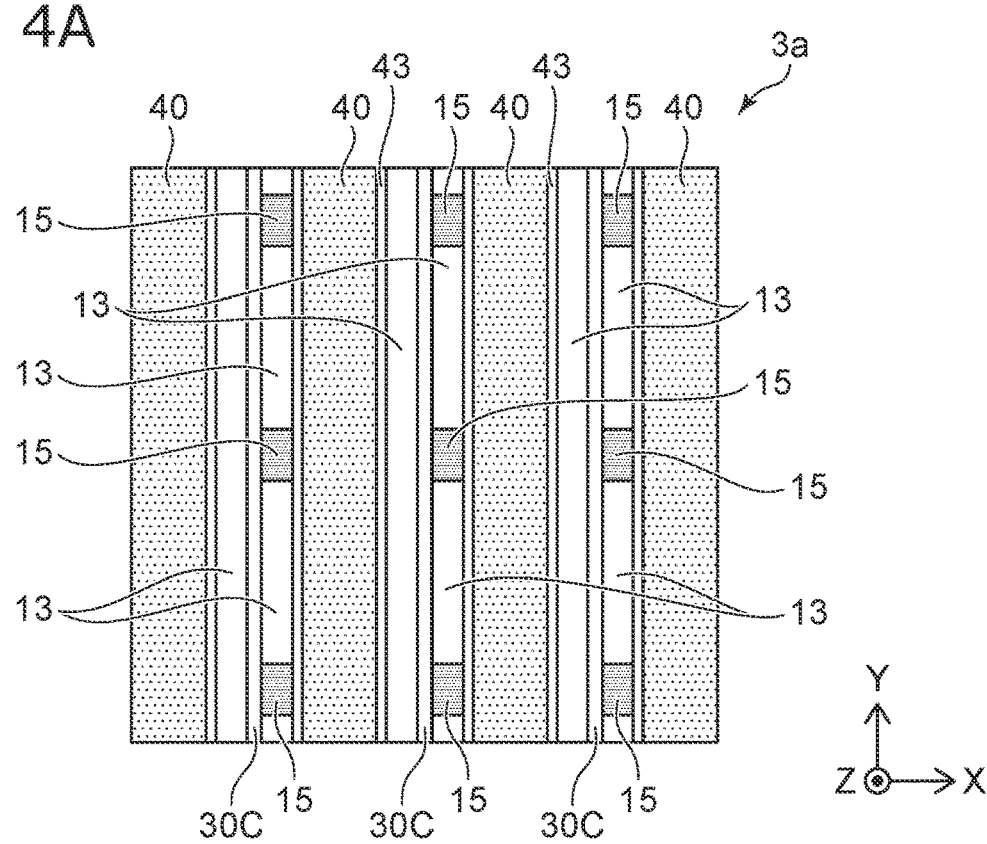
FIGS. 4A and 4B are schematic plan views showing semiconductor devices according to a first variation of the embodiment.
Figure 4B:
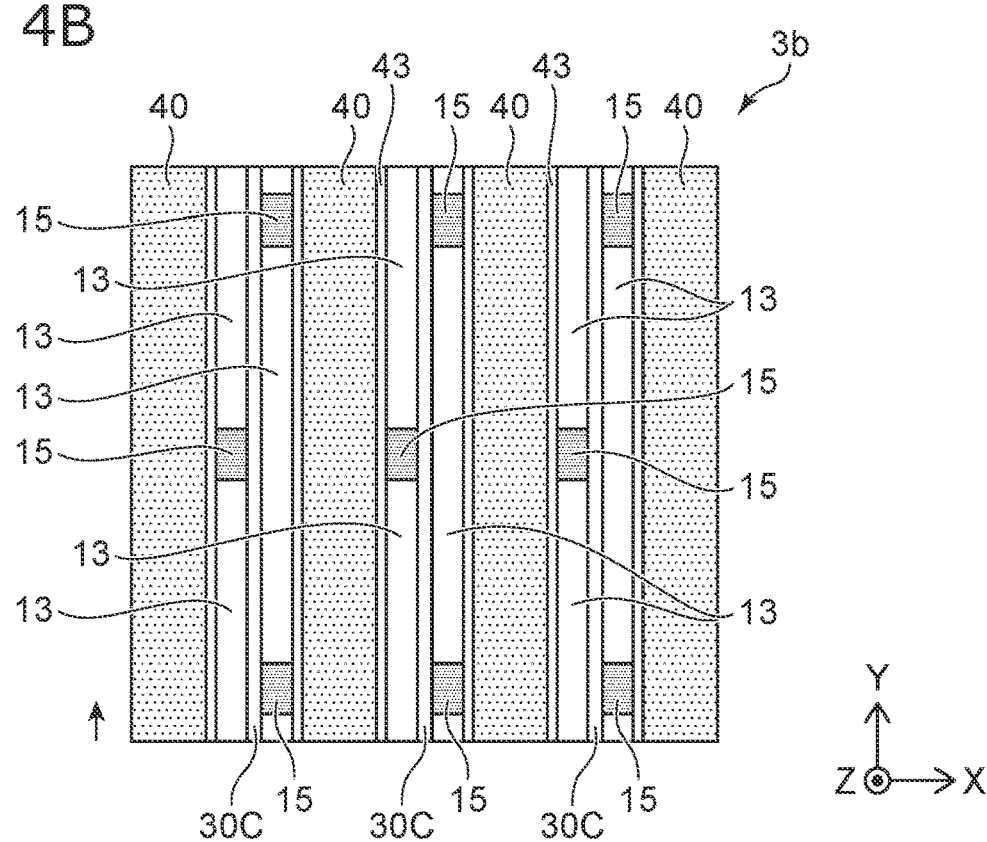

FIGS. 4A and 4B are schematic plan views showing semiconductor devices 3a and 3b according to a first variation of the embodiment. FIGS. 4A and 4B are cross-sectional views along A-A line shown in FIG. 1.

In the semiconductor device 3a shown in FIG. 4A, between the two adjacent third electrodes 40, the third semiconductor layers 15 are provided between one of the two adjacent third electrodes 40 and the trench contact 30C without providing the third semiconductor layer 15 between the other of the two adjacent third electrodes 40 and the trench contact 30C.

The semiconductor device 3b shown in FIG. 4B has a different arrangement of the third semiconductor layers 15 from the arrangement shown in FIG. 2. The semiconductor device 3b does not includes the adjacent third semiconductor layers 15 facing each other in the X-direction via a third electrode 40. That is, between the two third semiconductor layers 15 closest to each other in the X-direction, the third electrode 40 and a portion of the second semiconductor layer 13 are provided. In other words, in the X-direction, a third semiconductor layer 15 faces a portion of the second semiconductor layer 13 via a third electrode 40.

Figure 5A:
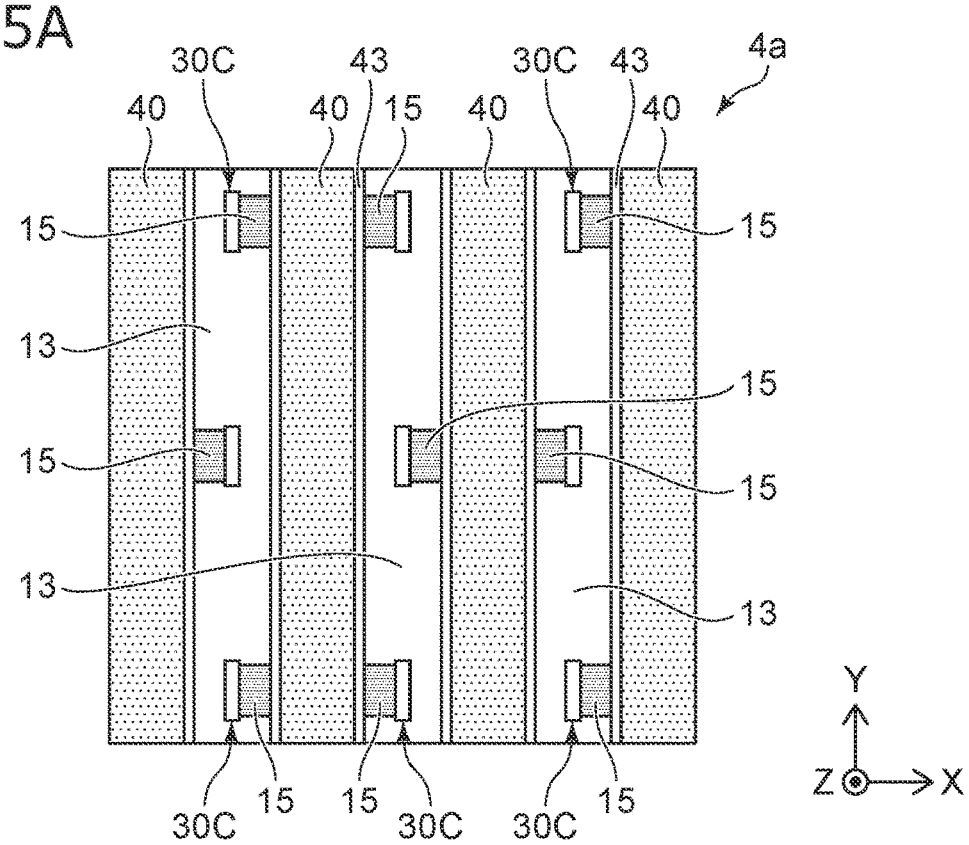
FIGS. 5A and 5B are schematic plan views showing semiconductor devices according to a second variation of the embodiment.
Figure 5B:
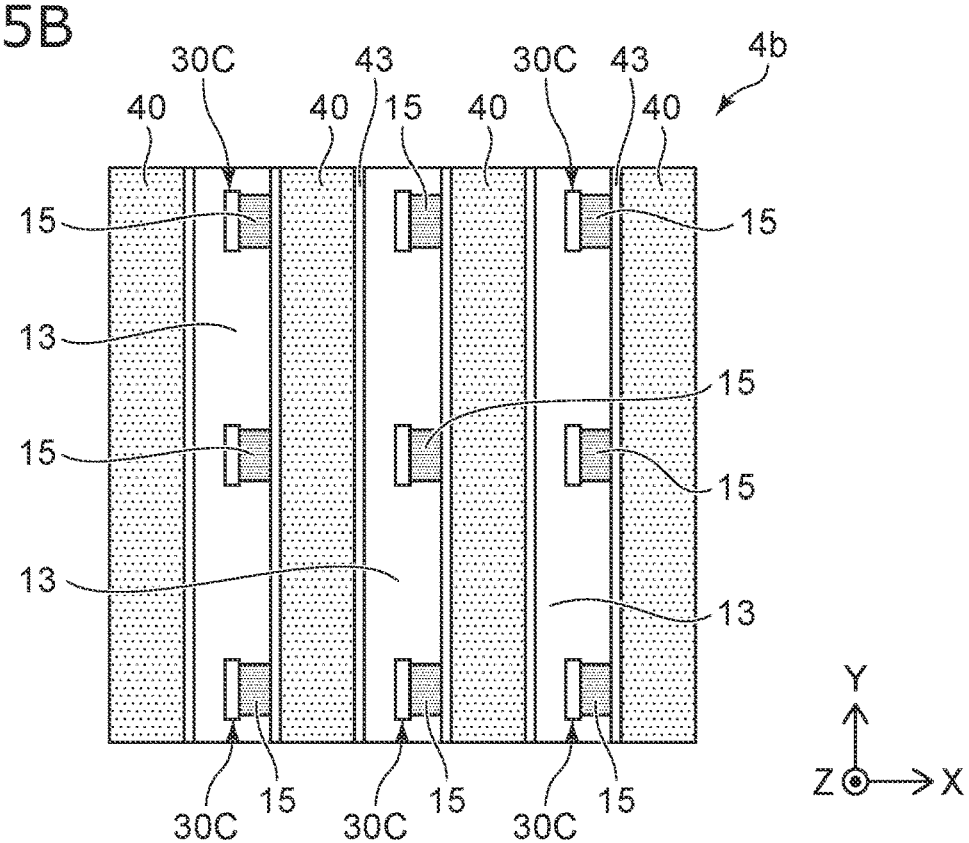

FIGS. 5A and 5B are schematic plan views showing semiconductor devices 4a and 4b according to a second variation of the embodiment. FIGS. 5A and 5B are cross-sectional views along A-A line shown in FIG. 1.

In the semiconductor device 4a shown in FIG. 5A, multiple trench contacts 30C are provided between the adjacent third electrodes 40. The multiple trench contacts 30C are arranged in the Y-direction and apart from each other. The third semiconductor layers 15 are provided respectively between each of the multiple trench contacts 30C and the third electrode 40. The third semiconductor layers 15 each are provided to face the second semiconductor layer 13 via a trench contact 30C in the X-direction.

In the semiconductor device 4b shown in FIG. 5B, the third semiconductor layers 15 are provided between one of the adjacent third electrodes 40 and each of the multiple trench contacts 30C. Any one of the third semiconductor layers 15 is not provided between the other of the adjacent third electrodes 40 and each of the multiple trench contacts 30C.

Figure 6A:
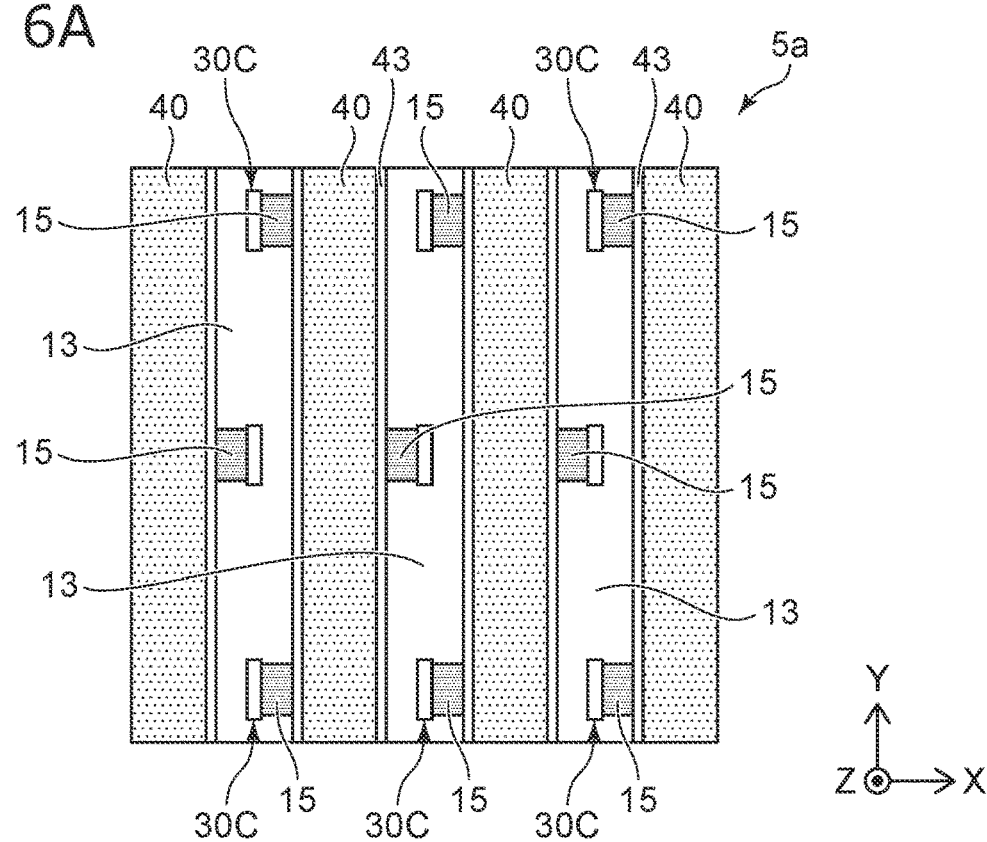
FIGS. 6A and 6B are schematic plan views showing semiconductor devices according to a third variation of the embodiment.
Figure 6B:
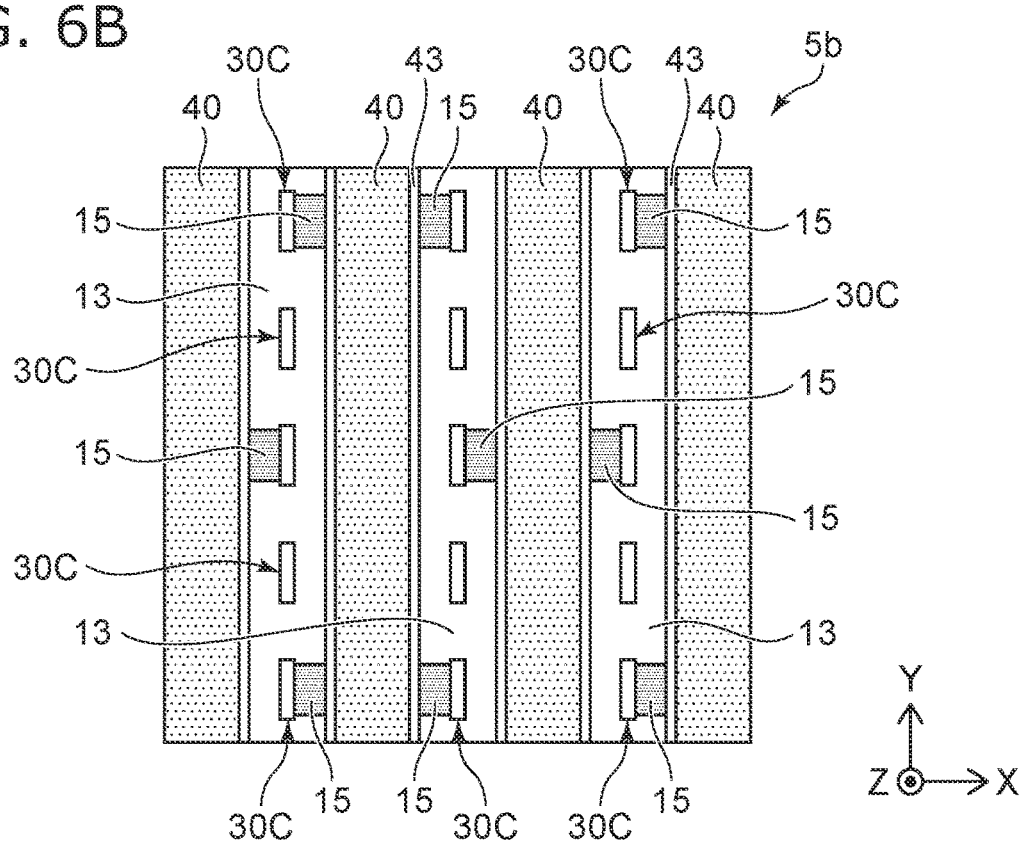

FIGS. 6A and 6B are schematic plan views showing semiconductor devices 5a and 5b according to a third variation of the embodiment. FIGS. 6A and 6B are cross-sectional views along A-A line shown in FIG. 1.

In the semiconductor device 5a shown in FIG. 6A, the multiple trench contacts 30C are arranged in the Y-direction and apart from each other. The third semiconductor layers 15 are arranged in a different manner from the arrangement shown in FIG. 5A. The third semiconductor layers 15 are arranged such that two third semiconductor layers 15 adjacent to each other in the X-direction do not face each other via a third electrode 40. That is, between the two third semiconductor layers 15 closest to each other in the X-axis direction, the third electrode 40 and a portion of the second semiconductor layer 13 are provided.

In the semiconductor device 5b shown in FIG. 6B, the multiple trench contacts 30C include a trench contact 30C that is not in contact with any one of the third semiconductor layers 15. That is, the semiconductor device 5b partially includes a contact region of the semiconductor part 10 and the second electrode 30 between the third electrodes 40 adjacent to each other in the X-direction in which any one of the third semiconductor layers 15 is not provided but a trench contact 30C is provided.

The arrangement examples of the multiple third semiconductor layers 15 and the trench contacts 30C between the two adjacent third electrodes 40 are described above, but the embodiment is not limited thereto. For example, another arrangement may be applied in which the specified features of the arrangement examples are combined. In any one of the examples, it is possible to reduce the distance La between the adjacent third semiconductor layers 15 in the Y-direction while maintaining a constant ration of the contact areas of the second semiconductor layers 13 and the third semiconductor layers 15 with respect to the second electrode 30. Accordingly, the forward current concentration can be relaxed, and the breakdown resistance can be improved.

Figure 7A:
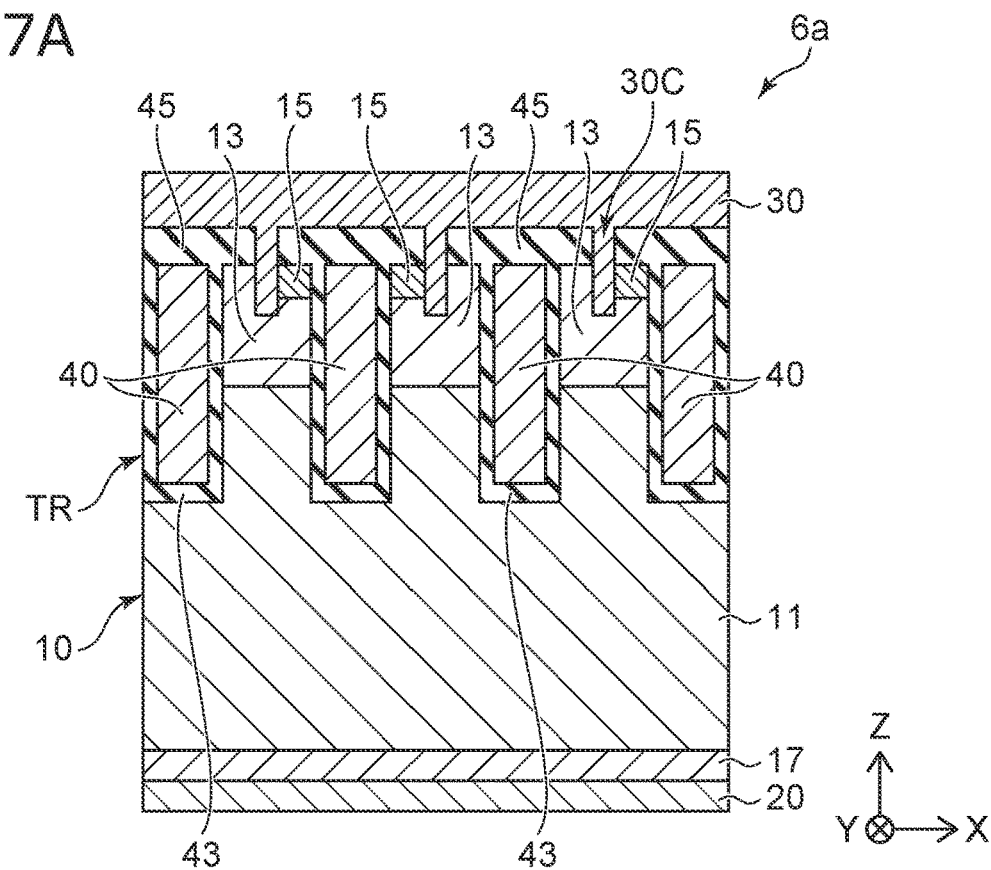
FIGS. 7A and 7B are schematic cross-sectional views showing semiconductor devices according to a fourth variation of the embodiment.
Figure 7B:
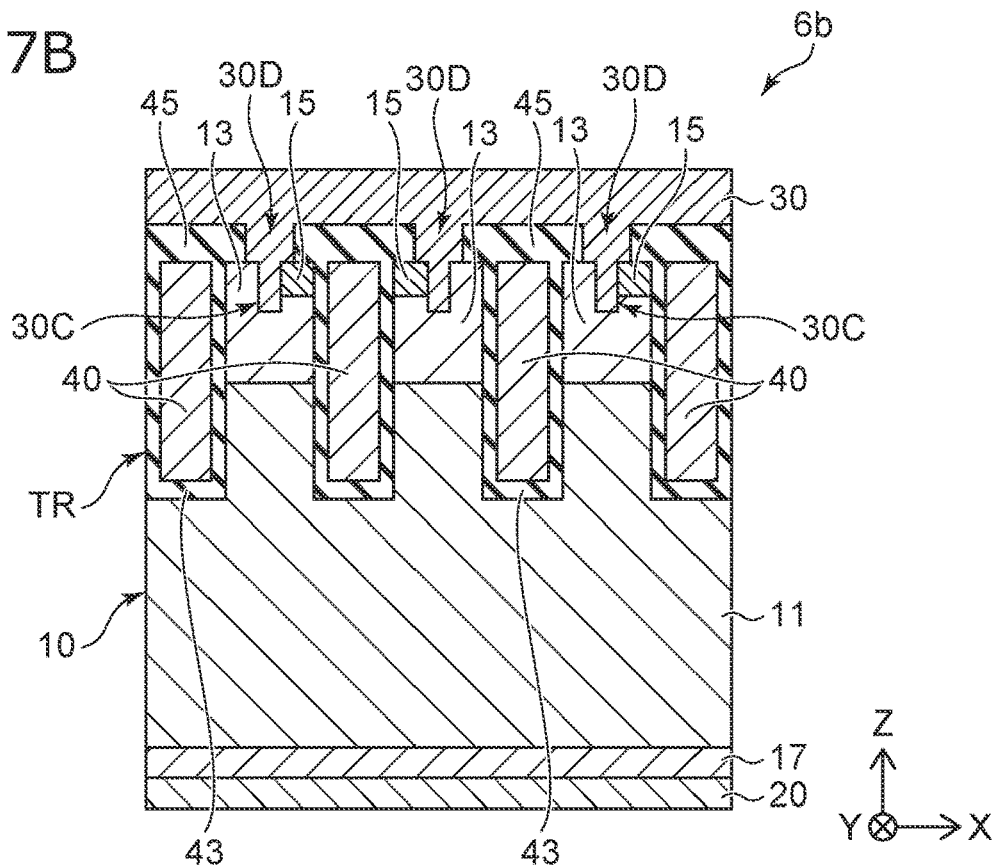

FIGS. 7A and 7B are schematic cross-sectional views showing semiconductor devices 6a and 6b according to a fourth variation of the embodiment. FIGS. 7A and 7B are cross-sectional views along B-B line shown in FIG. 2.

In the semiconductor device 6a shown in FIG. 7A, the interlayer insulating film 45 extends between the second semiconductor layer 13 and the second electrode 30 and between the third semiconductor layer 15 and the second electrode 30. The second semiconductor layer 13 and the third semiconductor layer 15 are electrically connected to the second electrode 30 via a contact surface contacting the trench contact 30C of the second electrode 30.

In the semiconductor device 6b shown in FIG. 7B, the second electrode 30 includes the trench contact 30C and a planar contact 30D. The trench contact 30C extends into the semiconductor part 10 and is provided to be in contact with the second semiconductor layers 13 and the third semiconductor layers 15. The planar contacts 30D are provided on the trench contacts 30C.

The planar contact 30D is provided to fill a contact hole provided in the interlayer insulating films 45. The planar contact 30D has a width in the X-direction greater than a width in the X-direction of the trench contact 30C. Accordingly, the planar contact 30D partially contacts the upper surfaces of the second semiconductor layer 13 and the third semiconductor layer 15.

The second semiconductor layers 13 and the third semiconductor layers 15 are provided such that the contact areas thereof contacting the trench contact 30C and the planar contact 30D of the second electrode 30 has a predetermined area ratio. In the examples, the forward current concentration can also be relaxed by reducing the distance La between the third semiconductor layers 15 adjacent to each other in the Y-direction.

Figure 8A:
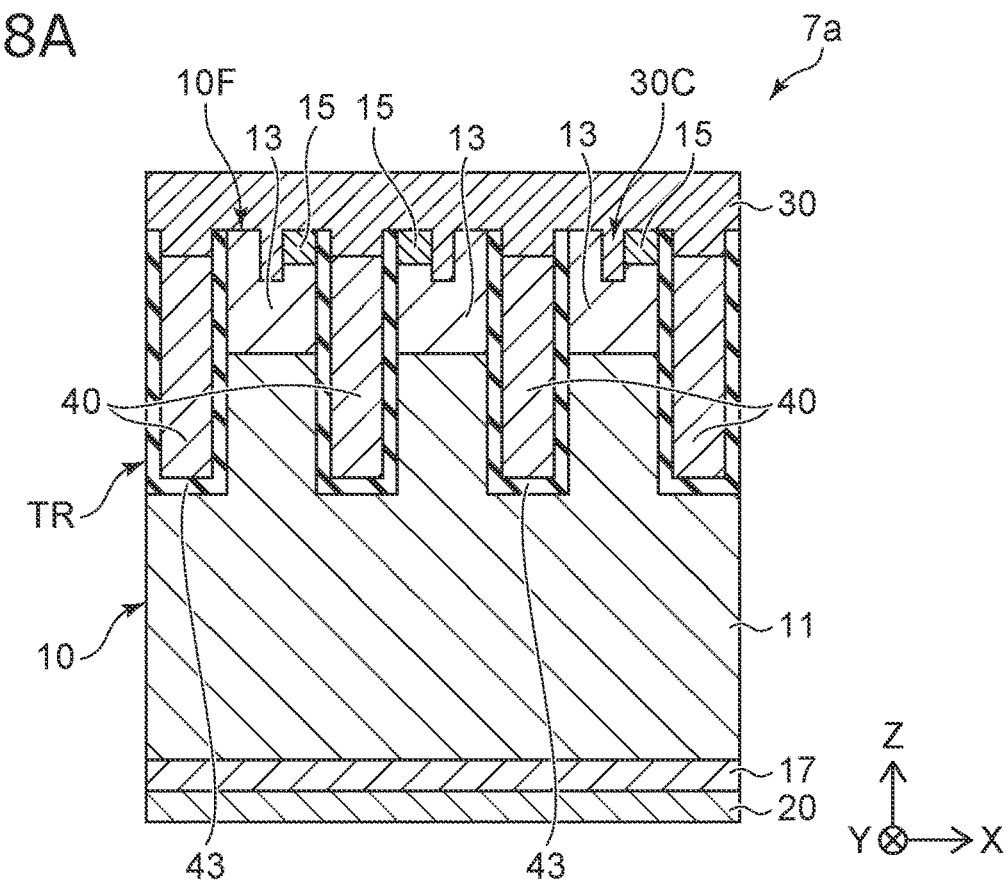
FIGS. 8A and 8B are schematic cross-sectional views showing semiconductor devices according to a fifth variation of the embodiment.
Figure 8B:
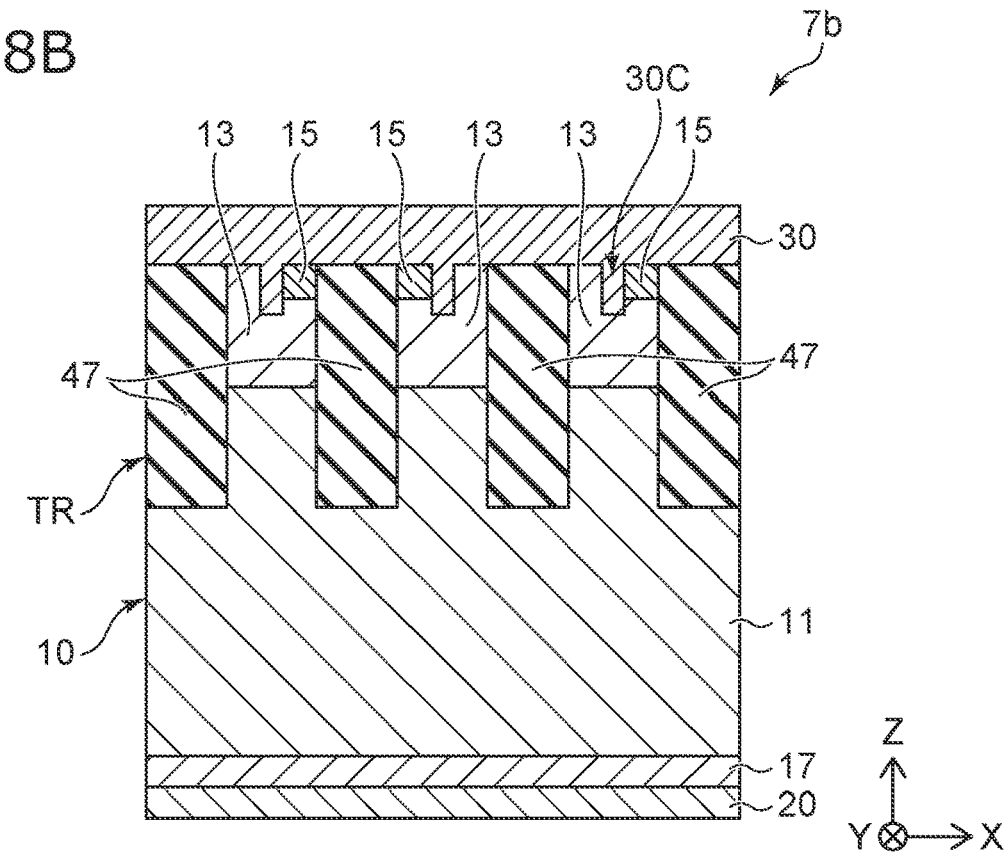

FIGS. 8A and 8B are schematic cross-sectional views showing semiconductor devices 7a and 7b according to a fifth variation of the embodiment. FIGS. 8A and 8B are cross-sectional views along B-B line shown in FIG. 2.

As shown in FIG. 8A, the third electrodes 40 of the semiconductor device 7a are connected to the second electrode 30 so that the third electrodes 40 is biased at a potential same as a potential of the second electrode 30. The second electrode 30 is electrically connected to the second semiconductor layers 13 and the third semiconductor layers 15 via the front surface 10F of the semiconductor part 10 and the trench contacts 30C.

In the semiconductor device 8b shown in FIG. 8B, inside the trenches TR, insulators 47 are provided respectively in place of the third electrodes 40. For example, the insulators 47 contact the second electrode 30 and extend into the first semiconductor layer 11. The insulators 47 are, for example, silicon oxide.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a semiconductor part including a first semiconductor layer of a first conductivity type, a second semiconductor layer of a second conductivity type, and a third semiconductor layer of the second conductivity type;
   a first electrode electrically connected to the first semiconductor layer of the semiconductor part;
   a second electrode electrically connected to the second semiconductor layer and the third semiconductor layer of the semiconductor part; and
   a plurality of third electrodes provided in the semiconductor part and electrically insulated from the semiconductor part by a first insulating film,
   the semiconductor part being provided between the first electrode and the second electrode,
   the first semiconductor layer extending between the first electrode and the second electrode,
   the second semiconductor layer being provided between the first semiconductor layer and the second electrode,
   the third semiconductor layer being partially provided on the second semiconductor layer between the second semiconductor layer and the second electrode, the third semiconductor layer including a second conductivity type impurity with a concentration higher than a concentration of a second conductivity type impurity in the second semiconductor layer, the plurality of third electrodes each being provided inside a first trench extending into the first semiconductor layer from a front surface of the semiconductor part at the second electrode side, the plurality of third electrodes including a first-third electrode and a second-third electrode, the first-third and second-third electrodes being adjacent to each other, the second semiconductor layer being provided between the first-third electrode and the second-third electrode, the second semiconductor layer facing the first-third electrode and the second-third electrode respectively via the first insulating film, the semiconductor part further including a second trench between the first-third electrode and the second-third electrode, the second trench extending from the front surface of the semiconductor part into the second semiconductor layer, the second electrode including a contact portion extending into the second trench, the third semiconductor layer being provided between the contact portion of the second electrode and the second-third electrode, the third semiconductor layer facing the second-third electrode via the first insulating film, the second semiconductor layer including a first portion provided between the contact portion of the second electrode and the first-third electrode, the third semiconductor layer facing the first portion of the second semiconductor layer via the contact portion of the second electrode, and the second semiconductor layer extending to the front surface of the semiconductor part in the first portion.

2. The device according to claim 1, wherein
the semiconductor part further includes a second-third semiconductor layer,
the second-third semiconductor layer is provided between the contact portion of the second electrode and the second-third electrode, the second-third semiconductor layer being apart from the third semiconductor layer, and
the second semiconductor layer further includes a second portion provided between the second-third semiconductor layer and the third semiconductor layer.

3. The device according to claim 2, wherein
the semiconductor part further includes a third-third semiconductor layer, and
the third-third semiconductor layer is provided between the contact portion of the second electrode and the first-third electrode, the third-third semiconductor layer facing the second portion of the second semiconductor layer via the contact portion of the second electrode.

4. The device according to claim 2, wherein
the plurality of third electrodes each extend in a first direction along the front surface of the semiconductor part,
the second portion of the second semiconductor layer is in contact with the third semiconductor layer and the second-third semiconductor layer, and
the second portion of the second semiconductor layer has a width in the first direction larger than a width of the third semiconductor layer in the first direction and a width of the second-third semiconductor layer in the first direction.

5. The device according to claim 4, wherein
the contact portion of the second electrode extends in the first direction, and
the third semiconductor layer and the second-third semiconductor layer are in contact with the contact portion of the second electrode.

6. The device according to claim 1, wherein
the second electrode further includes a second contact portion apart from the contact portion,
the contact portion and the second contact portion are arranged in the first direction between the first-third electrode and the second-third electrode,
the semiconductor part further includes a second-third semiconductor layer, the second-third semiconductor layer being provided between the second contact portion of the second electrode and the second-third electrode, and
the third semiconductor layer is in contact with the contact portion, and the second-third semiconductor layer is in contact with the second contact portion.

7. The device according to claim 6, wherein
the second electrode further includes a third contact portion apart from the contact portion and the second contact portion,
the third contact portion is provided between the contact portion and the second contact portion, the contact portion and the second and third contact portions being provided between the first-third electrode and the second-third electrode, the contact portion and the second and third contact portions being arranged in the first direction,
the semiconductor part further includes a third-third semiconductor layer, and
the third-third semiconductor layer is provided between the third contact portion of the second electrode and the first-third electrode.

8. The device according to claim 7, wherein
the second electrode further includes a fourth contact portion provided between the first-third electrode and the second-third electrode, the contact portion and the second to fourth contact portions being arranged in the first direction and apart from each other,
the second semiconductor layer includes a second portion provided between the fourth contact portion and the second-third electrode, and
the fourth contact portion of the second electrode is provided between the first portion and the second portion of the second semiconductor layer, the fourth contact portion being in contact with the first and second portions of the second semiconductor layer.

9. The device according to claim 1, wherein
the semiconductor part includes a plurality of the third semiconductor layers apart from each other between the contact portion of the second electrode and the second-third electrode,
the plurality of third semiconductor layers face the first portion of the second semiconductor layer via the contact portion of the second electrode, and
the second semiconductor layer includes a second portion provided between two adjacent third semiconductor layers of the plurality of third semiconductor layers.

10. The device according to claim 9, wherein
the plurality of third electrodes further include a third-third electrode adjacent to the second-third electrode,
the semiconductor part further includes a third portion of the second semiconductor layer provided between the second-third electrode and the third-third electrode, and
the plurality of third semiconductor layers face the third portion of the second semiconductor layer via the second-third electrode.

11. The device according to claim 1, wherein
the plurality of third electrodes further include a third-third electrode adjacent to the second-third electrode,
the semiconductor part further includes a fourth-third semiconductor layer provided between the second-third electrode and the third-third electrode, and
the third semiconductor layer provided between the second-third electrode and the contact portion of the second electrode faces the fourth-third semiconductor layer via the second-third electrode.

12. The device according to claim 1, wherein
the plurality of third electrodes further include a third-third electrode adjacent to the second-third electrode,
the semiconductor part further includes a third portion of the second semiconductor layer provided between the second-third electrode and the third-third electrode, and
the third semiconductor layer provided between the contact portion of the second electrode and the second-third electrode faces the third portion of the second semiconductor layer via the second-third electrode.

13. The device according to claim 1, further comprising:
a second insulating film provided between the second electrode and the plurality of third electrodes,
the second insulating film extending between the second semiconductor layer and the second electrode and between the third semiconductor layer and the second electrode, and
the second electrode being electrically connected to the second semiconductor layer and the third semiconductor layer via the contact portion.

14. The device according to claim 1, wherein the second electrode contacts the plurality of third electrodes, and is electrically connected to the plurality of third electrodes.

15. A semiconductor device comprising:
a semiconductor part including a first semiconductor layer of a first conductivity type, a second semiconductor layer of a second conductivity type, and a third semiconductor layer of the second conductivity type;
a first electrode electrically connected to the first semiconductor layer of the semiconductor part;
a second electrode electrically connected to the second semiconductor layer and the third semiconductor layer of the semiconductor part; and
a plurality of third electrodes provided in the semiconductor part and electrically insulated from the semiconductor part by a first insulating film,
the semiconductor part being provided between the first electrode and the second electrode,
the first semiconductor layer extending between the first electrode and the second electrode,
the second semiconductor layer being provided between the first semiconductor layer and the second electrode,
the third semiconductor layer being partially provided on the second semiconductor layer between the second semiconductor layer and the second electrode, the third semiconductor layer including a second conductivity type impurity with a concentration higher than a concentration of a second conductivity type impurity in the second semiconductor layer,
the plurality of third electrodes each being provided inside a first trench extending into the first semiconductor layer from a front surface of the semiconductor part at the second electrode side,
the plurality of third electrodes including a first-third electrode and a second-third electrode, the first-third and second-third electrodes being adjacent to each other,
the second semiconductor layer being provided between the first-third electrode and the second-third electrode, the second semiconductor layer facing the first-third electrode and the second-third electrode respectively via the first insulating film,
the semiconductor part further including a second trench between the first-third electrode and the second-third electrode, the second trench extending from the front surface of the semiconductor part into the second semiconductor layer, the second electrode including a contact portion extending into the second trench,
the third semiconductor layer being provided between the contact portion of the second electrode and the second-third electrode, the third semiconductor layer facing the second-third electrode via the first insulating film,
the second semiconductor layer including a first portion provided between the contact portion of the second electrode and the first-third electrode,
the third semiconductor layer facing the first portion of the second semiconductor layer via the contact portion of the second electrode,
the semiconductor part further including a second-third semiconductor layer,
the second-third semiconductor layer being provided between the contact portion of the second electrode and the second-third electrode, the second-third semiconductor layer being apart from the third semiconductor layer, and
the second semiconductor layer further including a second portion provided between the second-third semiconductor layer and the third semiconductor layer.

16. The device according to claim 15, wherein
the semiconductor part further includes a third-third semiconductor layer, and
the third-third semiconductor layer is provided between the contact portion of the second electrode and the first-third electrode, the third-third semiconductor layer facing the second portion of the second semiconductor layer via the contact portion of the second electrode.

17. The device according to claim 15, wherein
the plurality of third electrodes each extend in a first direction along the front surface of the semiconductor part,
the second portion of the second semiconductor layer is in contact with the third semiconductor layer and the second-third semiconductor layer, and
the second portion of the second semiconductor layer has a width in the first direction larger than a width of the third semiconductor layer in the first direction and a width of the second-third semiconductor layer in the first direction.

18. The device according to claim 17, wherein
the contact portion of the second electrode extends in the first direction, and
the third semiconductor layer and the second-third semiconductor layer are in contact with the contact portion of the second electrode.

19. The device according to claim 15, wherein
the second electrode further includes a second contact portion apart from the contact portion,
the contact portion and the second contact portion are arranged in the first direction between the first-third electrode and the second-third electrode,
the semiconductor part further includes a second-third semiconductor layer, the second-third semiconductor layer being provided between the second contact portion of the second electrode and the second-third electrode, and the third semiconductor layer is in contact with the contact portion, and the second-third semiconductor layer is in contact with the second contact portion.

20. A semiconductor device comprising:

a semiconductor part including a first semiconductor layer of a first conductivity type, a second semiconductor layer of a second conductivity type, and a third semiconductor layer of the second conductivity type;

a first electrode electrically connected to the first semiconductor layer of the semiconductor part;

a second electrode electrically connected to the second semiconductor layer and the third semiconductor layer of the semiconductor part;

a plurality of third electrodes provided in the semiconductor part and electrically insulated from the semiconductor part by a first insulating film; and a second insulating film provided between the second electrode and the plurality of third electrodes, the semiconductor part being provided between the first electrode and the second electrode, the first semiconductor layer extending between the first electrode and the second electrode, the second semiconductor layer being provided between the first semiconductor layer and the second electrode, the third semiconductor layer being partially provided on the second semiconductor layer between the second semiconductor layer and the second electrode, the third semiconductor layer including a second conductivity type impurity with a concentration higher than a concentration of a second conductivity type impurity in the second semiconductor layer, the plurality of third electrodes each being provided inside a first trench extending into the first semiconductor layer from a front surface of the semiconductor part at the second electrode side, the plurality of third electrodes including a first-third electrode and a second-third electrode, the first-third and second-third electrodes being adjacent to each other, the second semiconductor layer being provided between the first-third electrode and the second-third electrode, the second semiconductor layer facing the first-third electrode and the second-third electrode respectively via the first insulating film, the semiconductor part further including a second trench between the first-third electrode and the second-third electrode, the second trench extending from the front surface of the semiconductor part into the second semiconductor layer, the second electrode including a contact portion extending into the second trench, the third semiconductor layer being provided between the contact portion of the second electrode and the second-third electrode, the third semiconductor layer facing the second-third electrode via the first insulating film, the second semiconductor layer including a first portion provided between the contact portion of the second electrode and the first-third electrode, the third semiconductor layer facing the first portion of the second semiconductor layer via the contact portion of the second electrode, the second insulating film extending between the second semiconductor layer and the second electrode, and between the third semiconductor layer and the second electrode, and the second electrode being electrically connected to the second semiconductor layer and the third semiconductor layer via the contact portion.

\* \* \* \* \*